(12) United States Patent
Kijima

(10) Patent No.: US 7,268,617 B2
(45) Date of Patent: Sep. 11, 2007

(54) DOHERTY MICROWAVE AMPLIFIER AND SIGNAL PROCESSING METHOD THEREOF

(75) Inventor: Tooru Kijima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 11/298,525

(22) Filed: Dec. 12, 2005

(65) Prior Publication Data

US 2006/0152279 A1 Jul. 13, 2006

(30) Foreign Application Priority Data

Dec. 13, 2004 (JP) .............................. 2004-359705

(51) Int. Cl.
*H03F 3/68* (2006.01)

(52) U.S. Cl. .................. 330/124 R; 330/296; 330/289; 330/278

(58) Field of Classification Search ............ 330/124 R, 330/296, 289, 278
See application file for complete search history.

(56) References Cited

U.S. PATENT DOCUMENTS

| 5,786,727 | A |   | 7/1998  | Sigmon |             |
|-----------|----|---|---------|--------------|---------|
| 5,886,575 | A  | * | 3/1999  | Long         | 330/129 |
| 6,445,247 | B1 | * | 9/2002  | Walker       | 330/10  |
| 6,472,934 | B1 |   | 10/2002 | Pehlke       |         |
| 6,492,867 | B2 | * | 12/2002 | Bar-David    | 330/10  |
| 6,982,593 | B2 | * | 1/2006  | Robinson et al. | 330/10 |
| 7,218,175 | B1 | * | 5/2007  | Kobayashi    | 330/290 |
| 2006/0001485 | A1 | * | 1/2006 | Parker et al. | 330/124 R |

FOREIGN PATENT DOCUMENTS

| EP | 1 394 932 A1 | 3/2004 |
|----|--------------|--------|
| JP | 2002-124840  | 4/2002 |
| JP | 2004-173231  | 6/2004 |

OTHER PUBLICATIONS

R.J. McMorrow et al., "The Microwave Doherty Amplifier", IEEE MTT-S Digest, pp. 1653-1656, (1994).
Combined Search and Examination Report issued by the British Patent Office dated Mar. 17, 2006, for British Application No. GB0524806.7.
A German Patent Office Action dated Feb. 14, 2007.
Kim, Wan-Jong et al., Digital Predistortion of a Doherty Amplifier with a Weak Memory Within a Connected Solution, *IEEE*, pp. 2020-2023 (2004).

* cited by examiner

*Primary Examiner*—Patricia Nguyen
(74) *Attorney, Agent, or Firm*—Finnegan, Henderson, Farabow, Garrett & Dunner, L.L.P.

(57) ABSTRACT

A Doherty microwave amplifier having a main amplifier and a peaking amplifier, distributing and inputting an input signal to the main amplifier and the peaking amplifier to obtain an output signal by combining an output from the main amplifier and an output from the peaking amplifier, comprises a first coupler which branches and outputs a part of the input signal, a second coupler which branches and outputs a part of the output signal, and a bias control unit which feedback-controls a bias signal to the peaking amplifier, based on a difference between a level of a signal branched and output from the first coupler and a level of a signal branched and output from the second coupler.

10 Claims, 8 Drawing Sheets

DOHERTY MICROWAVE AMPLIFIER AND SIGNAL PROCESSING METHOD THEREOF

CROSS-REFERENCE TO RELATED APPLICATIONS

This application is based upon and claims the benefit of priority from prior Japanese Patent Application No. 2004-359705, filed Dec. 13, 2004, the entire contents of which are incorporated herein by reference.

BACKGROUND OF THE INVENTION

1. Field of the Invention

The present invention relates to a Doherty microwave amplifier (hereinafter, referred to as Doherty amplifier) and a signal processing method thereof.

2. Description of the Related Art

A Doherty amplifier is well known as an amplifier with high efficiency. The Doherty amplifier equipped with a main amplifier to perform linear amplification and a peaking amplifier to compensate deterioration in linearity of the main amplifier in a higher output area. Since the Doherty amplifier can obtain a large output by low power, it has been used even in a high-frequency area such as a microwave (refer to, for example, R. J. McMorrow, D. M. Voton, and P. R. Malonney "The Doherty microwave amplifier", 1994, IEEE MTTS Digest, TH3-E, 1994).

FIG. 1 is an exemplary block diagram showing an existing Doherty amplifier. The Doherty amplifier in FIG. 1 has a main amplifier 100, a peaking amplifier 200, an output load 300, a distributor 400 and a bias controller 500. The distributor 400 distributes a signal which is input to the Doherty amplifier into the main amplifier 100 and the peaking amplifier 200.

FIG. 2 is an exemplary view showing an input/output characteristic of the Doherty amplifier in FIG. 1. FIG. 2 shows an operation line ML of input to output of the main amplifier 100 and an operation line PL of input to output of the peaking amplifier 200. The peaking amplifier 200 starts its output from an S point at which the saturation of the output from the main amplifier 100 starts.

The bias controller 500 checks an input signal level of the Doherty amplifier to output a bias control voltage to the peaking amplifier 200 when the input signal level exceeds the input level at the S point. The peaking amplifier 200 compensates the deterioration in output from the main amplifier 100 to output an amplified signal to the output load 300. As a result, as shown with a dot line part in FIG. 2, a linear signal output combined with the output from the main amplifier 100 can be obtained at the output load 300 [refer to, for example, Jpn. Pat. Appln. KPKAI Publication No. 2004-173231 (eighth page, FIG. 2)].

However, in a configuration in FIG. 1, the input level at the S point from which the peaking amplifier 200 starts its operation is a fixed level in advance. Therefore, the changes in the input level from which the gains of the main amplifier 100 and the peaking amplifier 200 and the saturation of the main amplifier 100 start by the temperature make the existing amplifier impossible to accurately perform a linear compensation. And the existing Doherty amplifier becomes impossible to accurately perform the linear compensation also depending on the individual difference in the main amplifier 100.

The existing Doherty amplifier monitors an input signal level thereof and regulates a voltage of a bias signal to control an output from a peaking amplifier. Therefore, influence of a change in temperature or individual difference in Doherty amplifiers causes the problem that accurate linearity can not be obtained.

BRIEF SUMMARY OF THE INVENTION

According to an aspect of the present invention, there is provided a Doherty microwave amplifier having a main amplifier and a peaking amplifier, distributing and inputting an input signal to the main amplifier and the peaking amplifier to obtain an output signal by combining an output from the main amplifier and an output from the peaking amplifier, comprising: a first coupler which branches and outputs a part of the input signal; a second coupler which branches and outputs a part of the output signal; and a bias control unit which feedback-controls a bias signal to the peaking amplifier, based on a difference between a level of a signal branched and output from the first coupler and a level of a signal branched and output from the second coupler.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Hereinafter, embodiments of the present invention will be described with reference to the drawings.

FIRST EMBODIMENT

Figure 1:
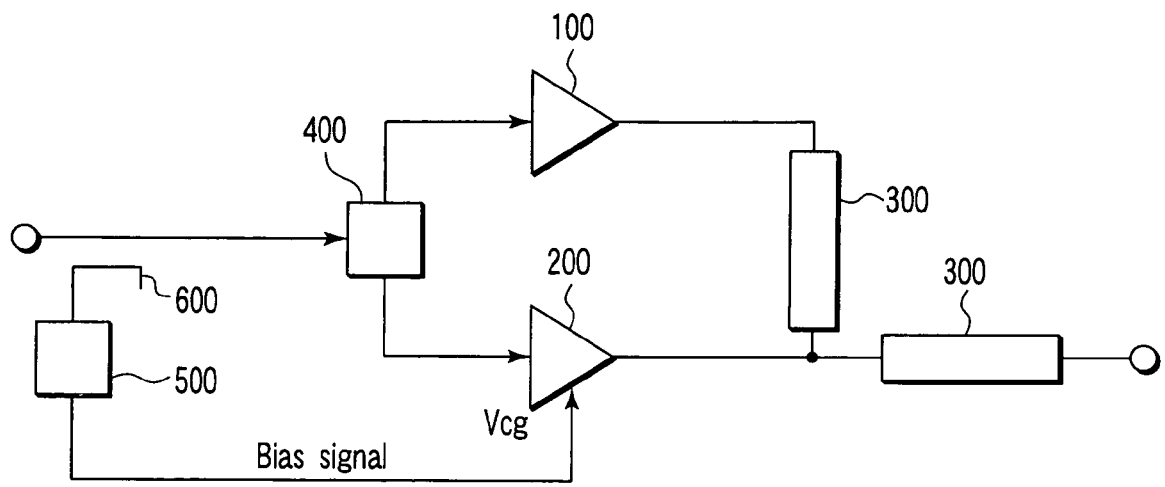
FIG. 1 is an exemplary block diagram showing a conventional Doherty microwave amplifier (hereinafter, referred to as Doherty amplifier)
Figure 2:
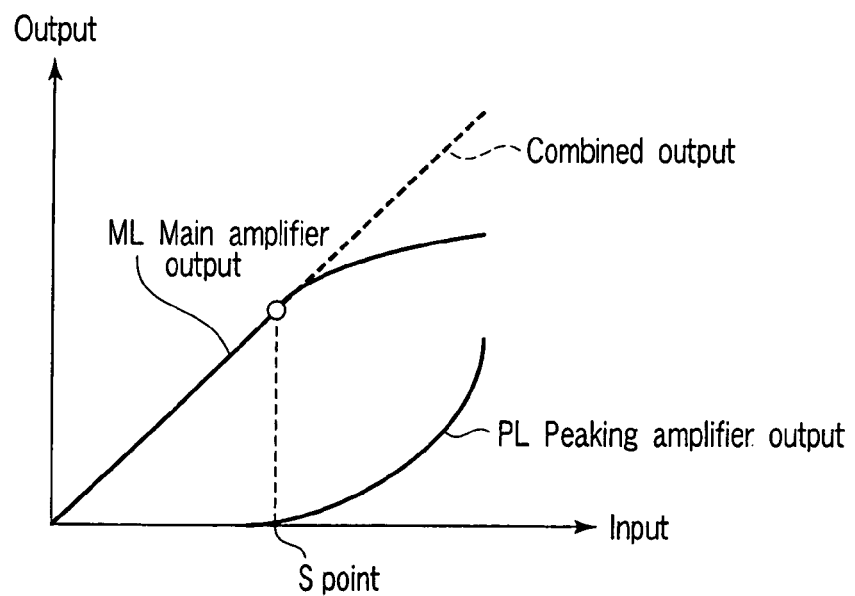
FIG. 2 is an exemplary view showing an input/output characteristic of the Doherty amplifier in FIG. 1.
Figure 3:
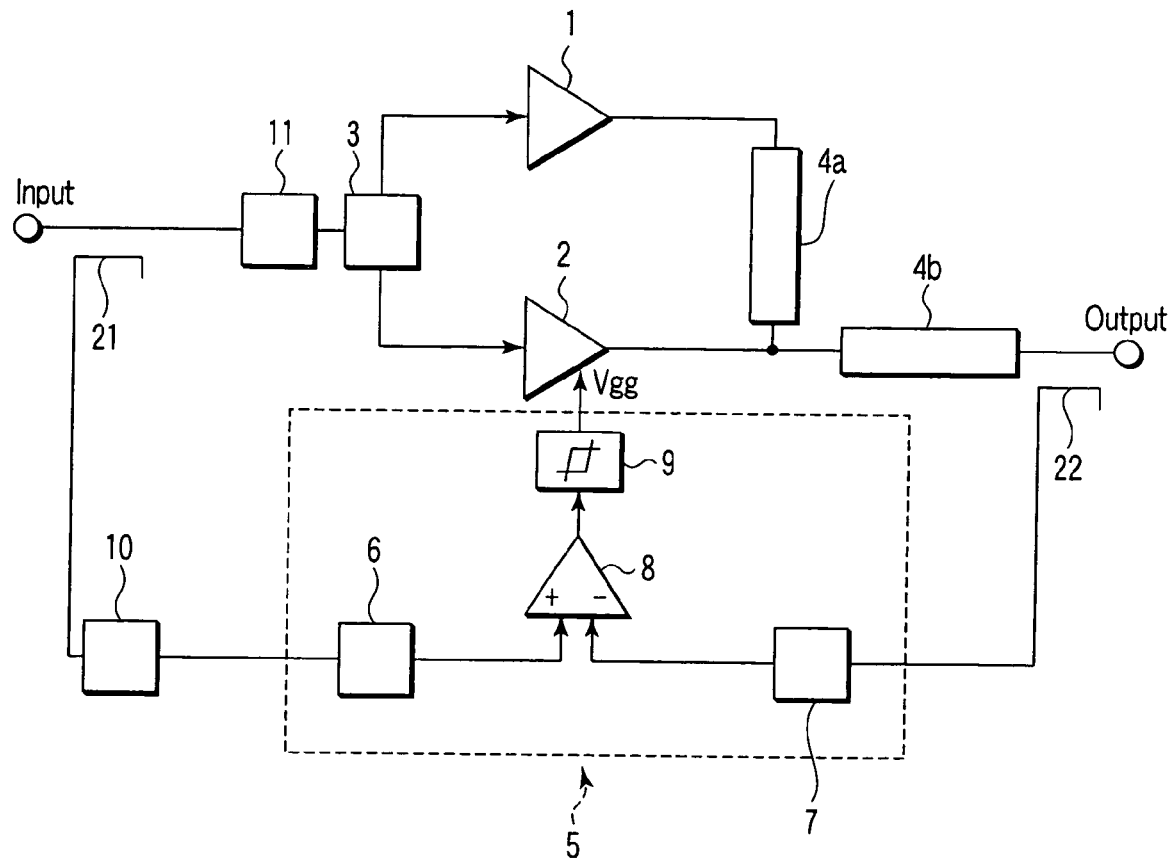
FIG. 3 is an exemplary block diagram showing a first embodiment of a Doherty amplifier regarding the present invention.
Figure 4:
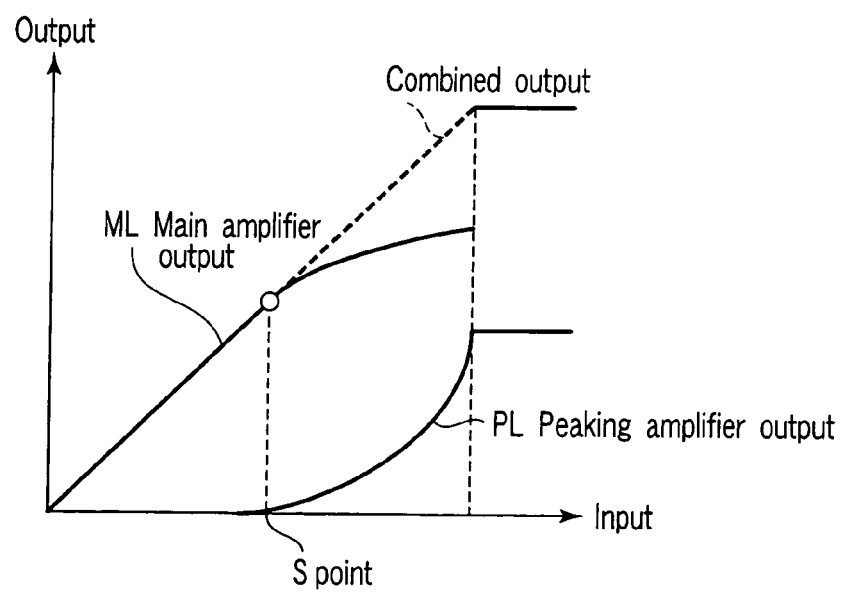
FIG. 4 is an exemplary view showing an input/output characteristic of the Doherty amplifier in FIG. 3.

FIG. 3 is the exemplary block diagram showing the first embodiment of the Doherty amplifier regarding the present invention. FIG. 4 is the exemplary view showing the input/output characteristic of the Doherty amplifier in FIG. 3. A configuration and an operation of the Doherty amplifier regarding the first embodiment of the present invention will be described by referring to FIG. 3 and FIG. 4.

In FIG. 3, the Doherty amplifier comprises a main amplifier 1, a peaking amplifier 2, a distributor 3, a ¼ wave length impedance converter 4a, a ¼ wave length impedance converter 4b, a bias control unit 5, a delay unit 10 and a temperature compensation attenuator 11. The bias control unit 5 comprises a detector 6, a detector 7, a level comparator 8 and an amplitude limiter 9. An input and an output are provided with couplers 21 and 22 in order to branch each signal to the level comparator 8, respectively.

In the Doherty amplifier regarding the first embodiment, the level comparator 8 checks the gain of the Doherty amplifier by comparing the signal levels at the input and the output. The amplitude limiter 9 then outputs a bias signal Vgg, constantly retaining the gain, namely, constantly retaining linearity, to the peaking amplifier 2. Hereinafter, operations of each part of the configuration of the Doherty amplifier will be described.

The main amplifier 1 is a high-output amplifier such as an AB-class amplifier with excellent linearity. The peaking amplifier 2 is a high-output amplifier such as a C-class amplifier and has an input terminal of the bias signal Vgg which is supplied to a signal input terminal so as to control an operation point.

A signal which is input to the Doherty amplifier is input to the distributor 3 through the temperature compensation attenuator 11 to compensate temperature changes of gains of the main amplifier 1 and the peaking amplifier 2. The input signal is branched into two branches by the distributor 3 and one is input to the main amplifier 1 and the other is input to the peaking amplifier 2. An output terminal of the main amplifier 1 is connected to an output terminal of the peaking amplifier 2 through the ¼ wave length impedance converter 4a. Furthermore, another ¼ wave length impedance converter 4b is connected to the output terminal of the peaking amplifier 2 and signals amplified respectively by the main amplifier 1 and the peaking amplifier 2 are combined to be output from the Doherty amplifier.

The coupler 21 branches a part of the input signal and extracts and outputs it to the detector 6 of the bias control unit 5 through the delay unit 10. The detector 6 detects the input signal to generate, for example, an input level signal Vi converted into a DC current. The input level signal Vi is output to one input terminal of the level comparator 8. The combined output signal is branched by the coupler 22 on the output side, converted into an output level signal Vo by the detector 7 of the bias control unit 5 and input to the other terminal of the level comparator 8.

If the input signal level is low, the main amplifier 1 operated linearly, so that the peaking amplifier 2 is brought into a cutoff state. For example, if the peaking amplifier 2 is configured by an FET, the bias signal Vgg is supplied to a gate of the FET of the peaking amplifier 2 from the bias control unit 5 so that a drain current of the FET becomes zero. When the input signal level becomes high then the output from the main amplifier 1 begins to saturate, the peaking amplifier 2 begins to operate. In such a state, the bias control unit 5 controls the bias signal Vgg so that the Doherty amplifier outputs an output linearly and obtains a gain constantly.

The level comparator 8 measures the output level signal Vo and the input level signal Vi in order to check the linearity. And if the prescribed gain is deteriorated (corresponding to the S point at which the output in FIG. 4 begins to saturate), the level comparator 8 outputs the bias signal Vgg to the peaking amplifier 2 through the amplitude limiter 9. For detecting this deterioration, in an area with the gain is retained constant therein, an attenuator or the like (not shown) adjusts in advance so that the output level signal Vo and the input level signal Vi become to an equivalent level with each other.

When the main amplifier 1 is saturated, the output level signal Vo becomes a value lower than that of the input level signal Vi. The level comparator 8 detects the difference to output the bias signal Vgg through the amplitude limiter 9 to the peaking amplifier 2 so that the output level signal Vo and the input level signal Vi are equal with each other.

In the peaking amplifier 2, the bias signal Vgg is supplied to a gate thereof, a drain current which has been in a cutoff state is fed so as to compensate an output from the saturated main amplifier 1 then an output is started. The output from the peaking amplifier 2 is combined with the output from the main amplifier 1. Then, the linearity of the Doherty amplifier is secured by outputting a voltage of the bias signal Vgg so as to constantly retain the gain of the level comparator 8.

Having described the gain becomes constant by controlling the bias signal by means of the level comparator 8 so that the output level signal Vo and the input level signal Vi becomes same in level. However, the level comparator 8 may perform numeric conversions for the output level signal Vo and the input level signal Vi to obtain the gain of the Doherty amplifier by using the numeric ratio between the level signals Vo and Vi and may control the bias voltage in order to make the gain constant.

The conventional Doherty amplifier measures only the input signal level and outputs the prescribed bias signal to the peaking amplifier 2 when the input signal level achieves one at which the saturation is assumed to be started. That is, the conventional Doherty amplifier control the gain by conduction open loop control, so that the Doherty amplifier cannot secure accurate linearity if the operations of the main amplifier 1 and the peaking amplifier 2 are different from the conditions which have set already.

On the other hand, the first embodiment of the present invention monitors the voltage of the bias signal Vgg by the operation of the amplitude limiter 9, and limits a maximum value of the bias signal Vgg so that the peaking amplifier 2 does not output with out of rating when an over input is supplied. The peaking amplifier 2 thereby can be protected and also its operation range is accurately set. And the linearity of the Doherty amplifier is effectively and accurately retained in the operation range. In the first embodiment, if the maximum output power of the main amplifier 1 and of the peaking amplifier 2 is set to M watts and P watts, respectively, (M+P) watts becomes the maximum output power of the Doherty amplifier.

The temperature compensation attenuator 11 is disposed on the input side of the distributor 3 so as to compensate operation variations due to a change in temperature of a gain or the like of the main amplifier 1 and the peaking amplifier 2. As a result, since the burden on the peaking amplifier 2 can be reduced because the amount of the change in gain and temperature variations of the point at which the output begins to saturate are suppressed, the stability of the Doherty amplifier is improved by preventing useless power consumption therein.

SECOND EMBODIMENT

Figure 5:
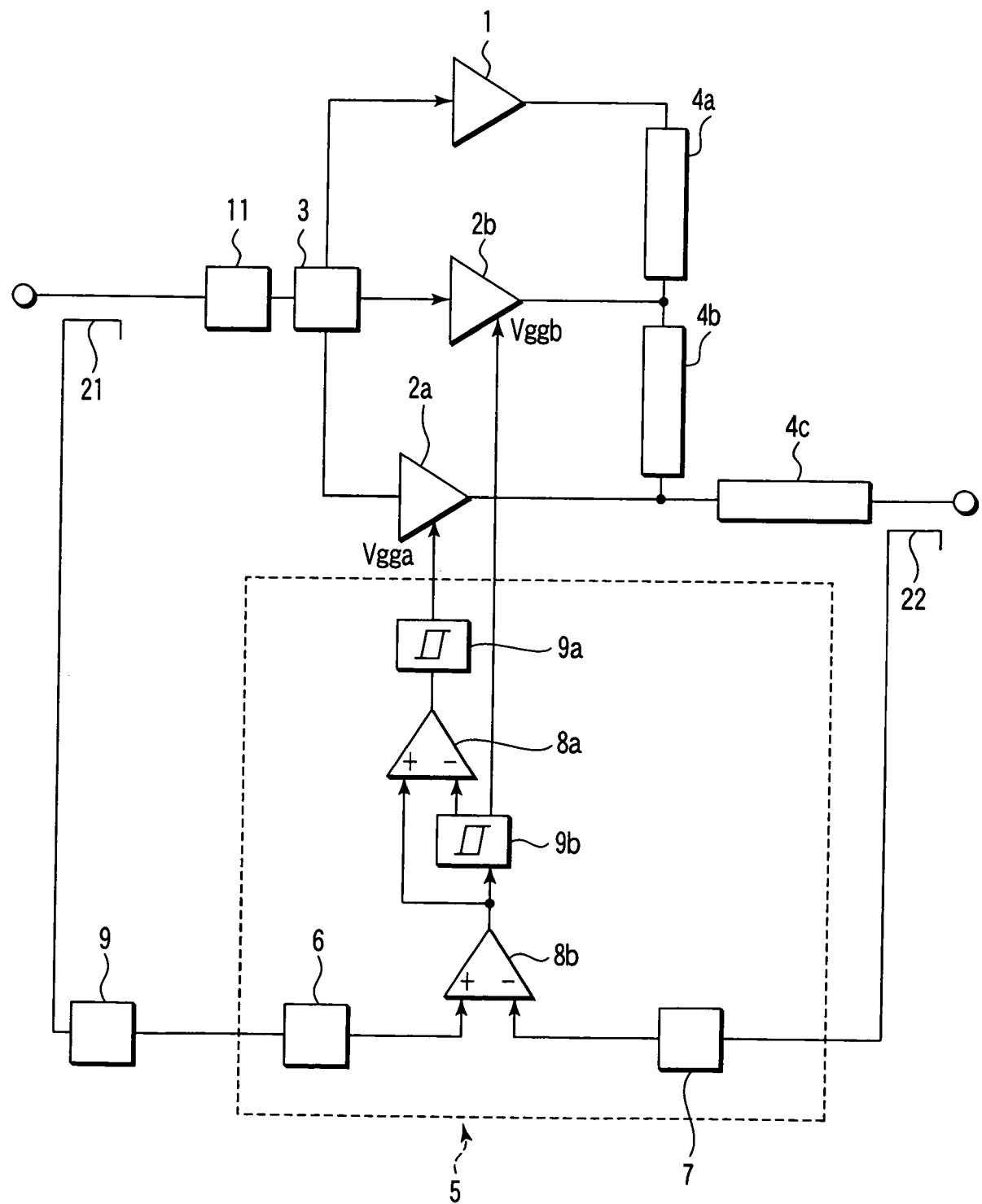
FIG. 5 is an exemplary block diagram showing a second embodiment of the Doherty amplifier regarding the present invention.
Figure 6:
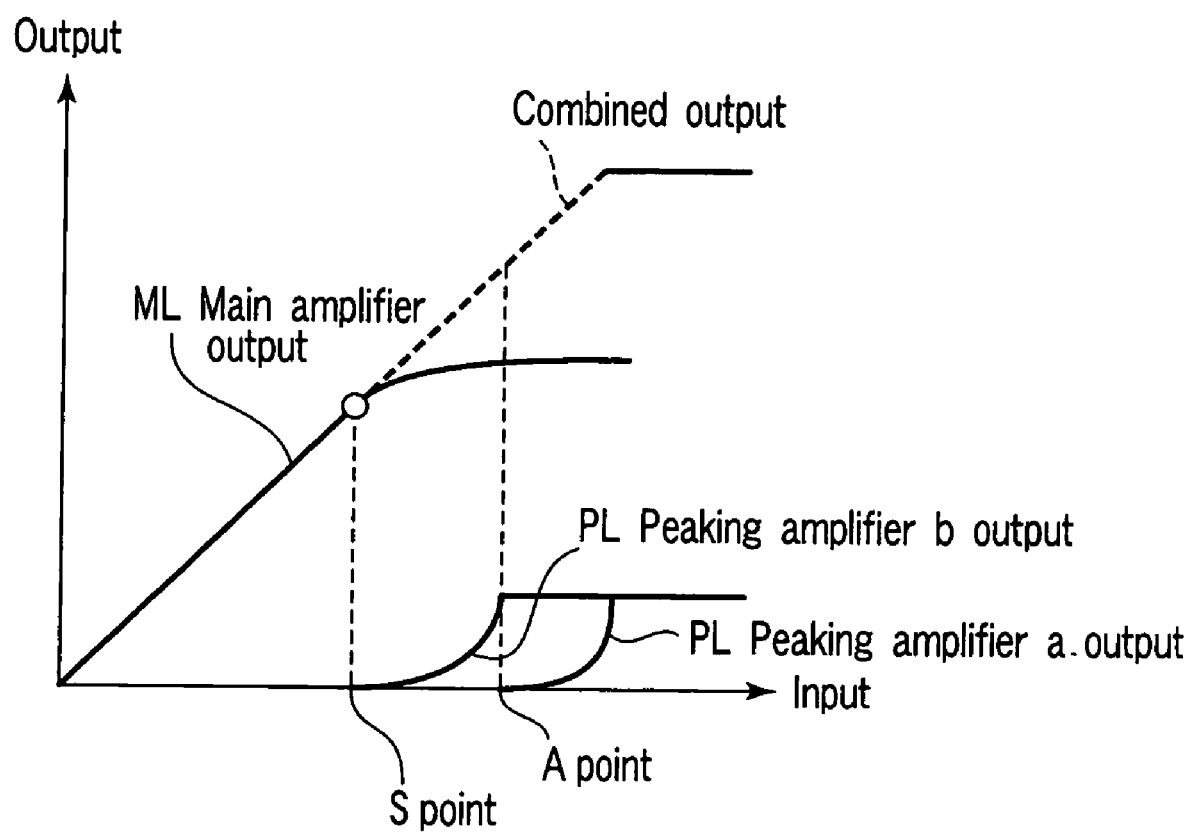
FIG. 6 is an exemplary view showing an input/output characteristic of the Doherty amplifier in FIG. 5.

FIG. 5 the exemplary block diagram showing the second embodiment of the Doherty amplifier regarding the present invention. FIG. 6 is the exemplary view showing the input/output characteristic of the Doherty amplifier in FIG. 5. The Doherty amplifier in FIG. 5 comprises peaking amplifiers 2a and 2b. A bias control unit 5 comprises level comparators 8a and 8b, amplitude limiters 9a and 9b and a ¼ wave length impedance converter 4c.

The ¼ wavelength impedance converter 4c connected to the output from the peaking amplifier 2b is further added to the output of the ¼ wavelength impedance converter 4b of the peaking amplifier 2a. Therefore, the output form the Doherty amplifier becomes the combined output of the main amplifier 1 and two peaking amplifiers 2a and 2b.

In the second embodiment, the combined output is input to the level comparator 8b through the detector 7. The level comparator 8b outputs a gate voltage Vggb to the peaking amplifier 2b and one input terminal of the level comparator 8a through the amplitude limiter 9b when the main amplifier 1 is brought into a saturation state.

The amplitude limiter 9b outputs the bias signal Vggb so as to compensate the output deterioration of the main amplifier 1 until the input voltage reaches an A point in FIG. 6. However, if the output of the peaking amplifier 2b at the A point (here, set to P watts) is the rated output of the peaking amplifier 2b, the peaking amplifier 2 is saturated by the output not less that P watts. Therefore, power is consumed uselessly, and in an extreme case, the Doherty amplifier gets out of order.

Then, like the first embodiment, the amplitude limiter 9b outputs a constant voltage so that the bias signal Vggb of the peaking amplifier 2b does not exceed an allowance voltage (for example, X volt). Thereby, the output of the peaking amplifier 2b is also retained at P watts.

Further, the second embodiment has a peaking amplifier 2a for parallel output so as to further increase the output even when the input voltage exceeds the A point in preparation for the case of necessity of more output power. That is, an output from the level comparator 8b (for example, Y volt) is input to one input terminal of the level comparator 8a and a bias signal Vggb (X volt at a maximum) is input as a comparison value from the amplitude limiter 9b.

In a state in which the peaking amplifier 2b operates within the rated range, voltages of each level signal which is respectively input to two terminals of the level comparator 8b are equal as X=Y. The output from the Doherty amplifier becomes large from this operation state and when the output of Y volt from the level comparator 8b exceeds X volt, differences among each level signal are generated. Accordingly, the level comparator 8a outputs the bias signal. Vgga to the peaking amplifier 2a through the amplitude limiter 9a so as to make input two voltages equal to each other.

If the peaking amplifiers 2a and 2b are same in specification, the maximum voltages of the bias signals Vgga and Vggb are the same X volt and the maximum voltage of the amplitude limiter 9a is also X volt. Like the peaking amplifier 2b, the peaking amplifier 2a outputs P watts as a maximum. Then, the total output of the main amplifier 1 and the peaking amplifiers 2a and 2b reaches (M+2P) watts.

In general, a semiconductor device with higher output has a fault to become slower in response time contrary to its allowance power. In the second embodiment, the Doherty amplifier can effectively increase maximum power without decreasing the response time, by using the lower-output peaking amplifiers 2 having the same specification with each other, by using them in parallel with each other.

Having described the case of parallel connection of two peaking amplifiers 2 herein, in addition to this case, even when a plurality of peaking amplifiers 2 are further connected in parallel with one another, it may be sufficient to increase the number of the peaking amplifiers 2, level comparators 8 and the amplitude limiters 9 as like the case of the second embodiment. The configuration and operations can be easily imagined, so that the description about them will be omitted.

THIRD EMBODIMENT

The first embodiment of the present invention can realize a high-efficiency amplifier superior to amplitude linearity. The second embodiment of the present invention can realize a Doherty type high-efficiency amplifier capable of retain a response time in high by a parallel use of low-output peaking amplifiers 2.

In the meantime, it is important for a high-frequency such as a microwave to retain constant in not only a response time but also a phase characteristic in accordance with an output. Therefore, in the third embodiment of the present invention, a configuration capable of obtaining an output with a constant phase characteristic even if not only an amplitude characteristic but also an output amplitude have changed (in other word, change in input amplitude) will be described.

Figure 7:
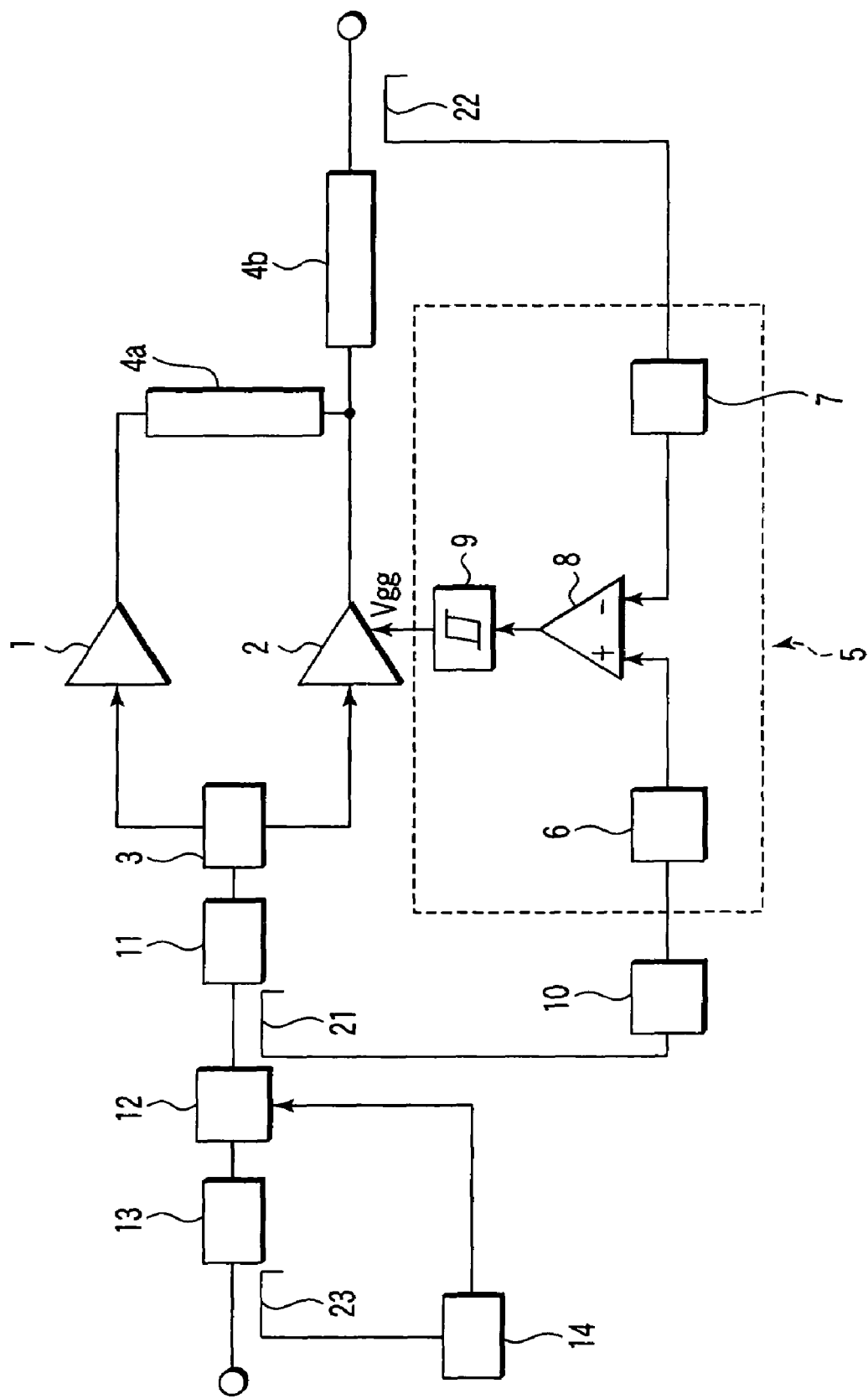
FIG. 7 is an exemplary block diagram showing a third embodiment of the Doherty amplifier regarding the present invention.

FIG. 7 is the exemplary block diagram showing the third embodiment of the Doherty amplifier regarding the present invention. The Doherty amplifier in FIG. 7 has a configuration in which a variable phase shifter 12, a delay unit 13, a detector 14 and a coupler 23 are added to the Doherty amplifier in FIG. 3. In FIG. 7, an input signal is input to the variable phase shifter 12 through the delay unit 13, and the output from the variable phase shifter 12 is input to the Doherty amplifier similar to that of the first embodiment. The input signal is branched and input to the detector 14 by the coupler 23. The detector 14 generates a DC phase bias signal or an input level signal corresponding to an input signal level to output it to the variable phase shifter 12.

Figure 8:
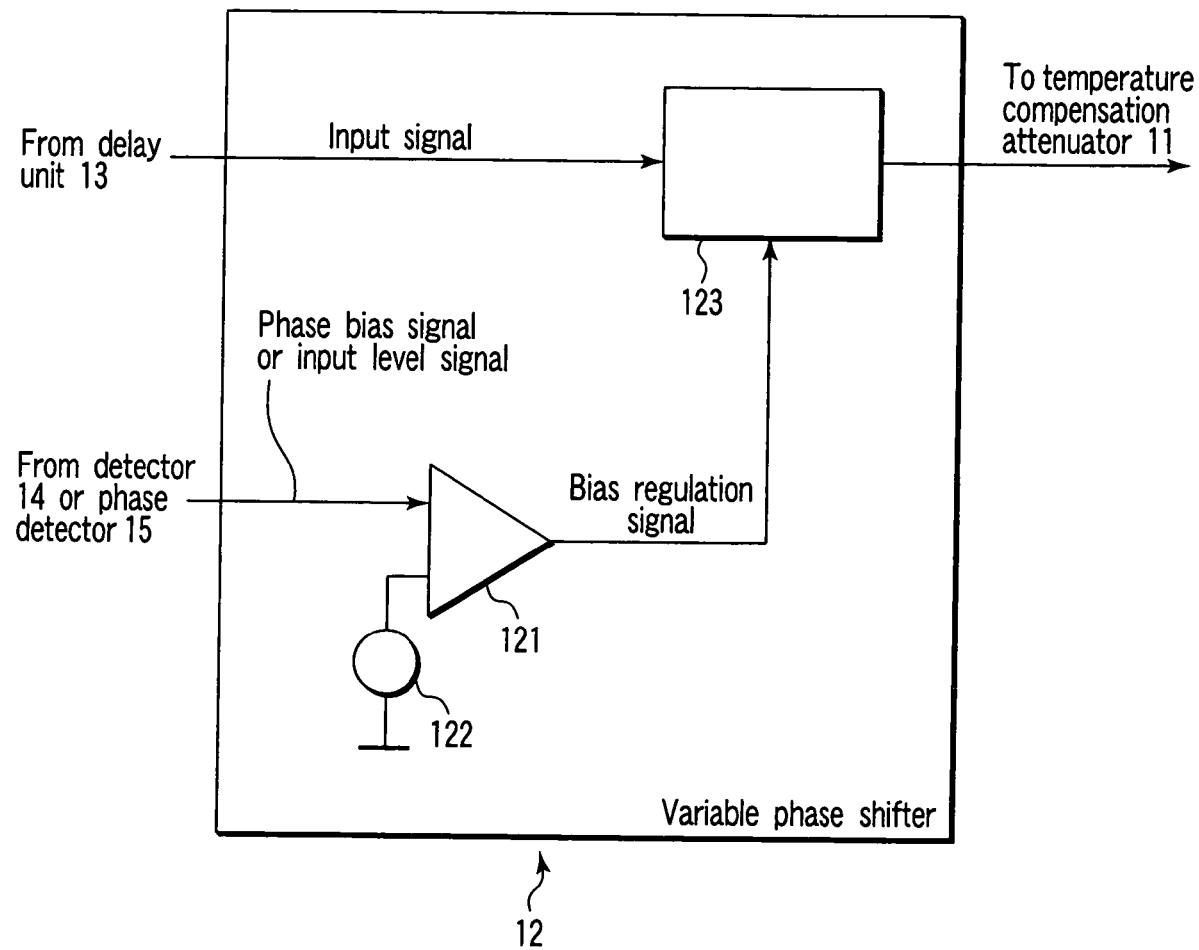
FIG. 8 is an exemplary block diagram showing a variable phase shifter in FIG. 7.

FIG. 8 is the exemplary block diagram showing the variable phase shifter 12 in FIG. 7. In FIG. 8, the variable phase shifter 12 comprises a differential amplifier 121, a reference voltage unit 122 and a phase regulator 123. It is assumed that a phase characteristic of the phase regulator 123 to a bias regulation signal has been known already. It is also assumed that a phase characteristic between the input signal level and the output from the Doherty amplifier has been known already. Accordingly, the bias regulation signal to give a phase to be compensated is obtained and supplied from the input signal level to the phase regulator 123.

On the other hand, an input signal is input to a signal input terminal of the phase regulator 123. A phase bias signal (input level signal) from the detector 23 is input to one input terminal of the differential amplifier 121. Then, a reference voltage set by the reference voltage unit 122 and needed to give a prescribed phase difference to the phase regulator 123 is input. This set phase is matched to, for example, the phase characteristic of the Doherty amplifier at a maximum input signal level.

The differential amplifier 121 outputs the bias regulation signal to the phase regulator 123 so as to bring the difference between the reference voltage and the phase bias signal to be input into a minimum value. The output from the Doherty amplifier thereby retains a constant phase characteristic regardless of the level of the input signal.

Figure 9:
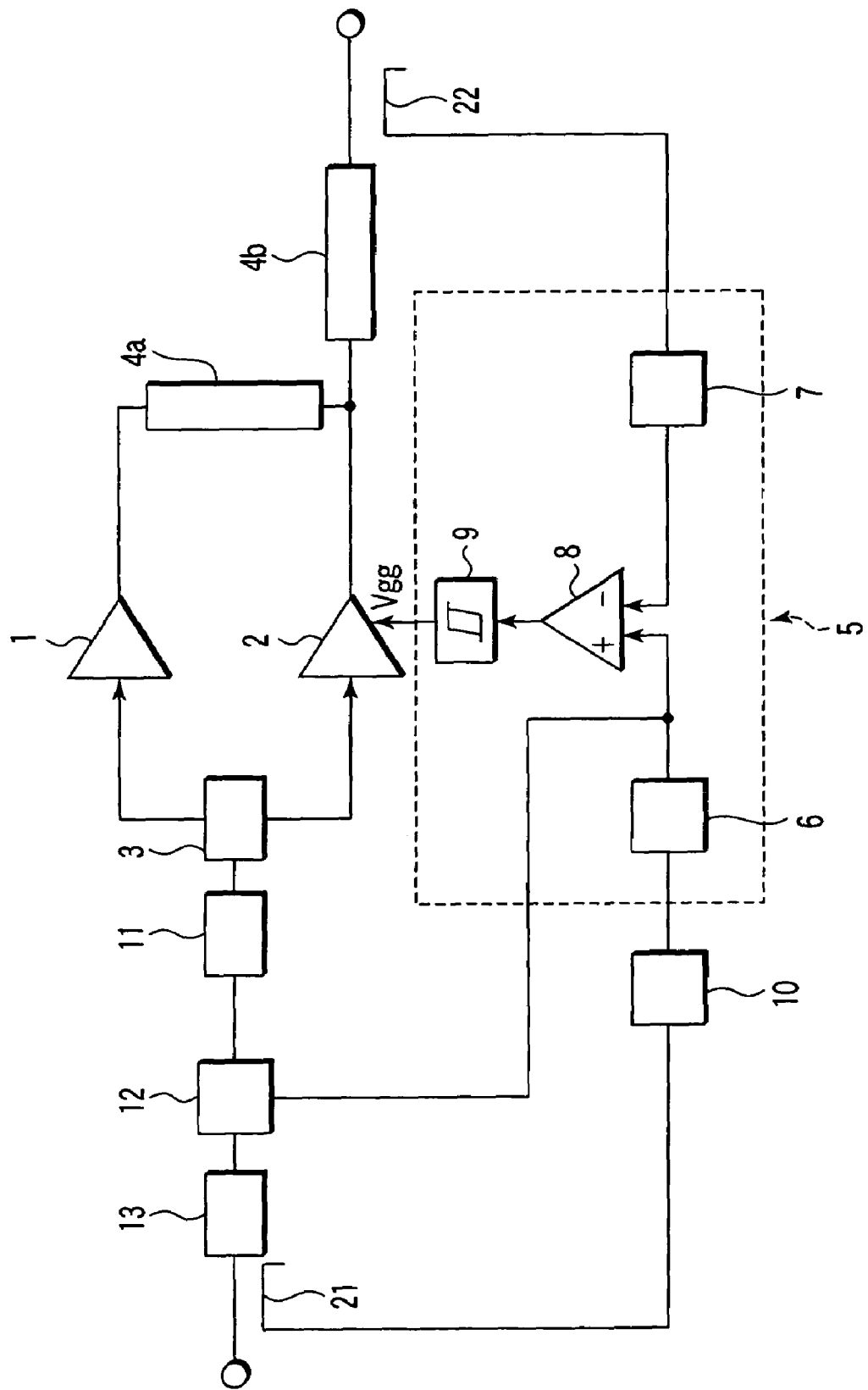
FIG. 9 is an exemplary block diagram showing another example of the Doherty amplifier regarding the third embodiment of the present invention.

FIG. 9 is an exemplary block diagram when a Doherty amplifier to perform a phase regulation is achieved by a simpler configuration. In FIG. 7, the detector 14 exclusively provided for a phase regulation outputs a phase bias signal or an input level signal to the variable phase shifter 12. The Doherty amplifier in FIG. 9 uses an input level signal that is an output from the detector 6, as a phase bias signal to be supplied to the variable phase shifter 12.

FOURTH EMBODIMENT

Figure 10:
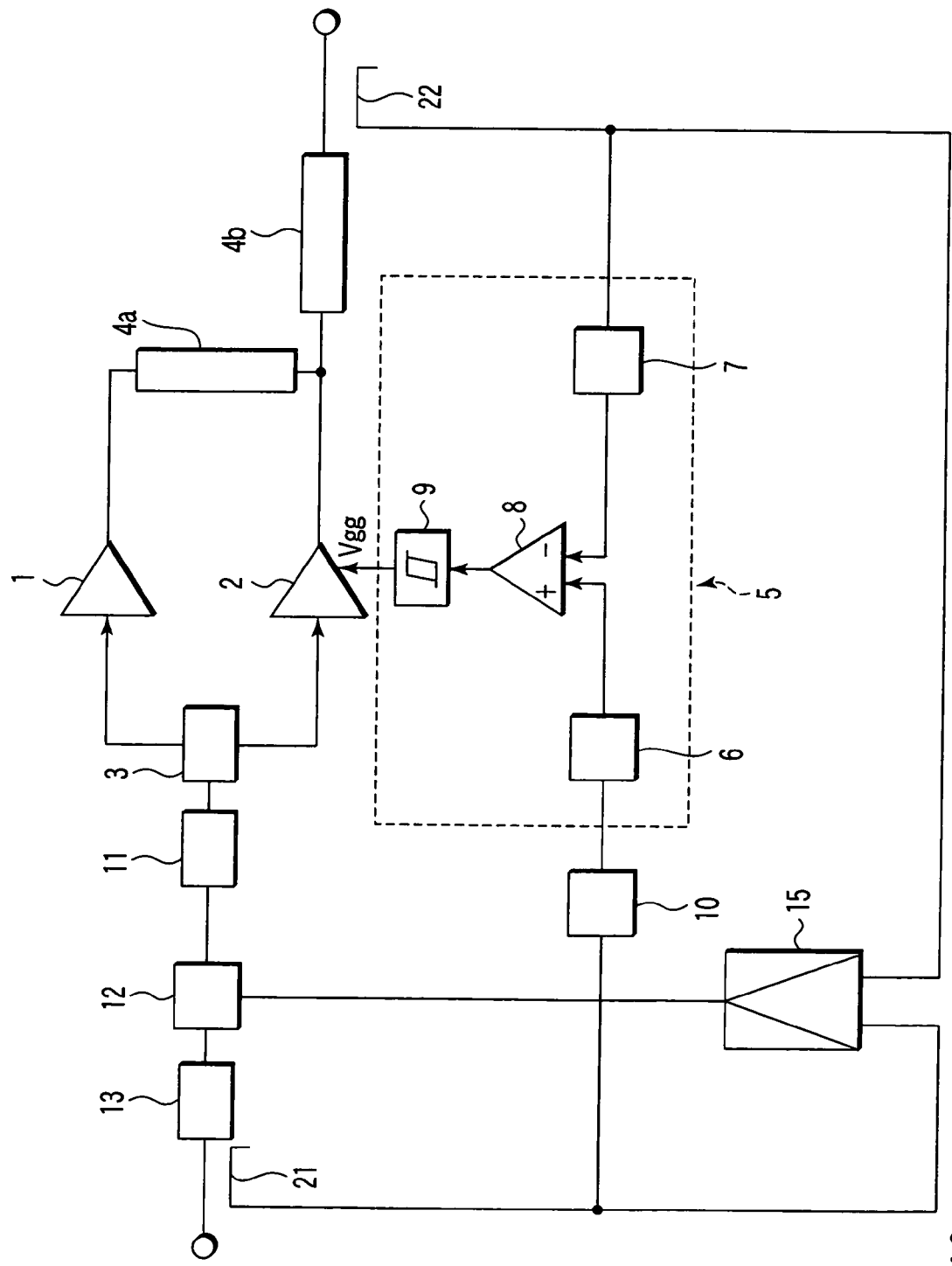
FIG. 10 is an exemplary block diagram showing a fourth embodiment of the Doherty amplifier regarding the present invention.

FIG. 10 the exemplary block diagram showing the fourth embodiment of the Doherty amplifier regarding the present invention. In FIG. 10, a combined signal is input to a phase detector 15, its phase signal is input to the variable phase shifter 12, as a phase bias signal, and each phase characteristic of the input signal and the output signal of Doherty amplifier is matched with each other by means of feedback control.

In the third embodiment, the Doherty amplifier measures an input signal to apply a bias corresponding to the input signal level to the phase regulator 123 and compensates a phase of an output signal by means of open loop control. On the contrary, in the fourth embodiment, the Doherty amplifier measures the input signal by using not the input signal but a phase characteristic of an output from the Doherty amplifier by means of the phase detector 15. The Doherty amplifier outputs the difference between the measurement result and the prescribed reference phase as a DC phase bias signal to the variable phase shifter 123 to feedback-control the phase of the output signal. By feedback controlling, a Doherty amplifier of which the linearity is improved and of which the phase characteristic is not influenced with the input signal level can be achieved.

A phase compensation method for the Doherty amplifier in the third and fourth embodiments may be also adapted to the case that the Doherty amplifiers respectively use a plurality of peaking amplifiers like the forgoing second embodiment.

As described above, according to the present invention, a Doherty amplifier with excellent linearity can be realized. And according to the present invention, a Doherty amplifier with improved linearity and with a stable phase characteristic of an output against a level change in input signal can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A Doherty microwave amplifier having a main amplifier and a peaking amplifier, distributing and inputting an input signal to the main amplifier and the peaking amplifier to obtain an output signal by combining an output from the main amplifier and an output from the peaking amplifier, comprising:
    a first coupler which branches and outputs a part of the input signal;
    a second coupler which branches and outputs a part of the output signal; and
    a bias control unit which feedback-controls a bias signal to the peaking amplifier, based on a difference between a level of a signal branched and output from the first coupler and a level of a signal branched and output from the second coupler.

2. The Doherty microwave amplifier according to claim 1, further comprising:
    a plurality of the peaking amplifiers, wherein
    the bias control unit controls bias signals to the plurality of the peaking amplifiers, respectively.

3. The Doherty microwave amplifier according to claim 1, wherein
    the bias control unit has an amplitude limiter which limits a maximum value of the bias signal.

4. The Doherty microwave amplifier according to claim 1, further comprising:
    a variable phase shifter which compensates a phase of a signal distributed and input to the main amplifier and the peaking amplifier in accordance with a level of the input signal.

5. The Doherty microwave amplifier according to claim 1, further comprising:
    a temperature compensation attenuator which has an attenuation characteristic to compensate temperature versus gain characteristics of the main amplifier and the peaking amplifier, wherein
    the input signal is branched and input to the main amplifier and the peaking amplifier through the temperature compensation attenuator.

6. The Doherty microwave amplifier according to claim 1, further comprising:
    a delay unit which delays the input signal to compensate delay in the bias control unit.

7. The Doherty microwave amplifier according to claim 1, wherein
    the bias control unit comprises:
    a first detector which outputs an input level signal generated by detecting the input signal;
    a second detector which outputs an output level signal generated by detecting the combined output signal; and
    a level comparator of which one input terminal inputs the input level signal and of which the other terminal inputs the output level signal, and which compares the input level signal to the output level signal for outputting a bias signal to control a gain of the output signal versus the input signal so as to be a prescribed value to an amplitude limiter when the gain becomes lower than the prescribed value.

8. The Doherty microwave amplifier according to claim 7, further comprising:
    a variable phase shifter which compensates phase characteristic variations for input signal levels of the main amplifier and the peaking amplifiers by bean of an input level signal which is output from the first detector or a third detector disposed in front of the first detector, wherein
    the input signal is distributed and input to the main amplifier and the peaking amplifier though the variable phase shifter.

9. The Doherty microwave amplifier according to claim 1, further comprising:

a phase detector and a variable phase shifter, wherein the input signal is input to the main amplifier and the peaking amplifier through the variable phase shifter;

the phase detector outputs an error voltage that is a difference between a phase of the output signal and a reference phase, as a phase bias signal, to the variable phase shifter;

the variable phase shifter feedback-controls the phase of the output signal to a prescribed phase by the phase bias signal.

10. A signal processing method for a Doherty microwave amplifier having a main amplifier and a peaking amplifier and outputting an output signal in which an output from the main amplifier to linearly amplify an input signal and an output from the peaking amplifier to amplify and output a signal controlled by a bias signal and distributed from the input signal are combined, wherein the Doherty microwave amplifier comprises the main amplifier, the peaking amplifier, a first detector, a second detector, a level comparator and an amplitude limiter, the first detector outputs an input level signal generated by detecting the input signal to one input terminal of the level comparator, the second detector outputs an output level signal generated by detecting the combined output signal to the other input terminal of the level comparator, the level comparator compares the input level signal to the output level signal for outputting a bias signal to control a gain of the output signal versus the input signal so as to be a prescribed value to the amplitude limiter when the gain becomes lower than the prescribed value, and the amplitude limiter limits the bias signal, which is input thereto, to a prescribed voltage to output the bias signal to the peaking amplifier.

* * * * *

UNITED STATES PATENT AND TRADEMARK OFFICE
CERTIFICATE OF CORRECTION

PATENT NO. : 7,268,617 B2 Page 1 of 1
APPLICATION NO. : 11/298525
DATED : September 11, 2007
INVENTOR(S) : Kijima It is certified that error appears in the above-identified patent and that said Letters Patent is hereby corrected as shown below:

Claim 8, column 8, line 62, change "bean" to --means--.

Signed and Sealed this

Fourth Day of December, 2007

JON W. DUDAS
*Director of the United States Patent and Trademark Office*